(12) United States Patent
Jin et al.

(10) Patent No.: US 11,056,177 B2
(45) Date of Patent: Jul. 6, 2021

(54) CONTROLLER, MEMORY SYSTEM INCLUDING THE SAME, AND METHOD OF OPERATING THE MEMORY SYSTEM

(71) Applicant: SK hynix Inc., Gyeonggi-do (KR)

(72) Inventors: Yong Jin, Seoul (KR); Seung Ok Han, Gyeonggi-do (KR); Sun Hong Min, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 6 days.

(21) Appl. No.: 16/524,731

(22) Filed: Jul. 29, 2019

(65) Prior Publication Data
US 2020/0176048 A1    Jun. 4, 2020

(30) Foreign Application Priority Data

Nov. 29, 2018  (KR) .................. 10-2018-0151317

(51) Int. Cl.
| | | |
|---|---|---|
| *G11C 7/22* | (2006.01) | |
| *G11C 11/409* | (2006.01) | |
| *G06F 13/16* | (2006.01) | |
| *G11C 11/22* | (2006.01) | |

(52) U.S. Cl.
CPC ........ *G11C 11/409* (2013.01); *G06F 13/1673* (2013.01); *G11C 11/2273* (2013.01); *G11C 11/2275* (2013.01)

(58) Field of Classification Search
CPC .............. G11C 11/409; G11C 11/2273; G11C 11/2275; G06F 13/1673
See application file for complete search history.

(56) References Cited

U.S. PATENT DOCUMENTS

| | | | | |
|---|---|---|---|---|
| 2013/0159815 A1* | 6/2013 | Jung | ................... | G06F 12/0246 |
| | | | | 714/773 |
| 2016/0364153 A1* | 12/2016 | Nam | ...................... | G11C 16/00 |
| 2018/0075912 A1* | 3/2018 | Shimizu | ................ | G11C 7/1042 |
| 2019/0188127 A1* | 6/2019 | Lee | ...................... | G06F 11/1068 |
| 2020/0026466 A1* | 1/2020 | Takano | ................. | G06F 3/0613 |

FOREIGN PATENT DOCUMENTS

| | | |
|---|---|---|
| KR | 10-2016-0144563 | 12/2016 |
| KR | 10-2018-0041898 | 4/2018 |

\* cited by examiner

*Primary Examiner* — Toan K Le
(74) *Attorney, Agent, or Firm* — IP & T Group LLP

(57) ABSTRACT

A memory system includes a memory device configured to store data through a write operation and output the stored data as read data through a read operation; a buffer memory configured to store the read data output from the memory device; a controller configured to control the memory device such that the memory device performs the read operation in response to a read request received from a host, and to control the buffer memory to store the read data in the buffer memory. When the read request corresponds to an asynchronous read operation, the controller may allocate a partial area of the buffer memory as storage space for the read data after the read operation of the memory device is completed.

20 Claims, 10 Drawing Sheets

{#CONTROLLER, MEMORY SYSTEM INCLUDING THE SAME, AND METHOD OF OPERATING THE MEMORY SYSTEM}

CROSS-REFERENCE TO RELATED APPLICATION

The present application claims priority under 35 U.S.C. § 119(a) to Korean patent application number 10-2018-0151317, filed on Nov. 29, 2018, the entire disclosure of which is incorporated herein by reference in its entirety.

BACKGROUND

Field of Invention

Various embodiments of the present disclosure generally relate to an electronic device, and more particularly, to a controller, a memory system including the controller, and a method of operating the memory system.

Description of Related Art

Recently, the paradigm for the computer environment has transitioned to ubiquitous computing so that computer systems can be used anytime and anywhere. Thereby, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device of the portable electronic devices.

A data storage device using a memory device provides advantages in that, since there is no mechanical driving part, stability and durability are excellent, information access speed is increased, and power consumption is reduced. Data storage devices employed in memory systems having such advantages include a universal serial bus (USB) memory device, a memory card having various interfaces, and a solid state drive (SSD).

Memory devices are classified into volatile memory devices and nonvolatile memory devices.

A nonvolatile memory device, although having comparatively low read and write speeds, retains data stored therein even when power supply is interrupted. Therefore, the nonvolatile memory device is used when there is the need for storing data required to be retained regardless of whether or not the device is connected to a power supply. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory may be a NOR type memory or a NAND type memory.

SUMMARY

Various embodiments of the present disclosure are directed to a memory system capable of improving the efficiency of a buffer memory by adjusting an allocation time of the buffer memory during a read operation of the memory system, and a method of operating the memory system.

An embodiment of the present disclosure may provide for a memory system including: a memory device configured to store data through a write operation and output the stored data as read data through a read operation; a buffer memory configured to store the read data output from the memory device; a controller configured to control the memory device such that the memory device performs the read operation in response to a read request received from a host, and to control the buffer memory such that the read data is stored in the buffer memory, wherein, when the read request corresponds to an asynchronous read operation as the read operation, the controller allocates a partial area of the buffer memory as storage space for the read data after the read operation of the memory device is completed.

An embodiment of the present disclosure may provide for a memory system including: a memory device configured to store data, read stored data and output read data; a buffer memory configured to store read data received from the memory device; and a controller configured to control the memory device such that the memory device performs a read operation in response to a read request received from a host. The controller may include: a processor configured to generate the internal command by parsing the read request, and generate a command queue by queuing the generated internal command; a flash control circuit configured to output a memory command to the memory device in response to the command queue; and a subsidiary buffer control circuit configured to allocate, when the internal command is an asynchronous read command corresponding to an asynchronous read operation as the read operation, storage space for storing the read data to the buffer memory after the memory device completes the asynchronous read operation in response to the memory command.

An embodiment of the present disclosure may provide for a method of operating a memory system, including: parsing, when a read request is received from a host, the read request, and generating an internal command; outputting, when the internal command is an asynchronous read command, the asynchronous read command to the memory device; performing, by the memory device, an asynchronous read operation in response to the asynchronous read command; allocating storage space for storing read data that is read from the memory device to a buffer memory after the memory device completes the asynchronous read operation; receiving the read data from the memory device and storing the read data in the allocated storage space of the buffer memory; and outputting the read data stored in the allocated storage space to the host.

An embodiment of the present disclosure may provide for a controller including: a processor configured to parse a read request received from a host, queue an internal command, and generate a command queue; a buffer memory configured to store read data received from a memory device, and output the stored read data to the host; and a buffer memory control circuit configured to allocate, when the internal command corresponds to an asynchronous read operation, storage space for storing the read data to the buffer memory after the asynchronous read operation of the memory device is completed.

DETAILED DESCRIPTION

Figure 1:
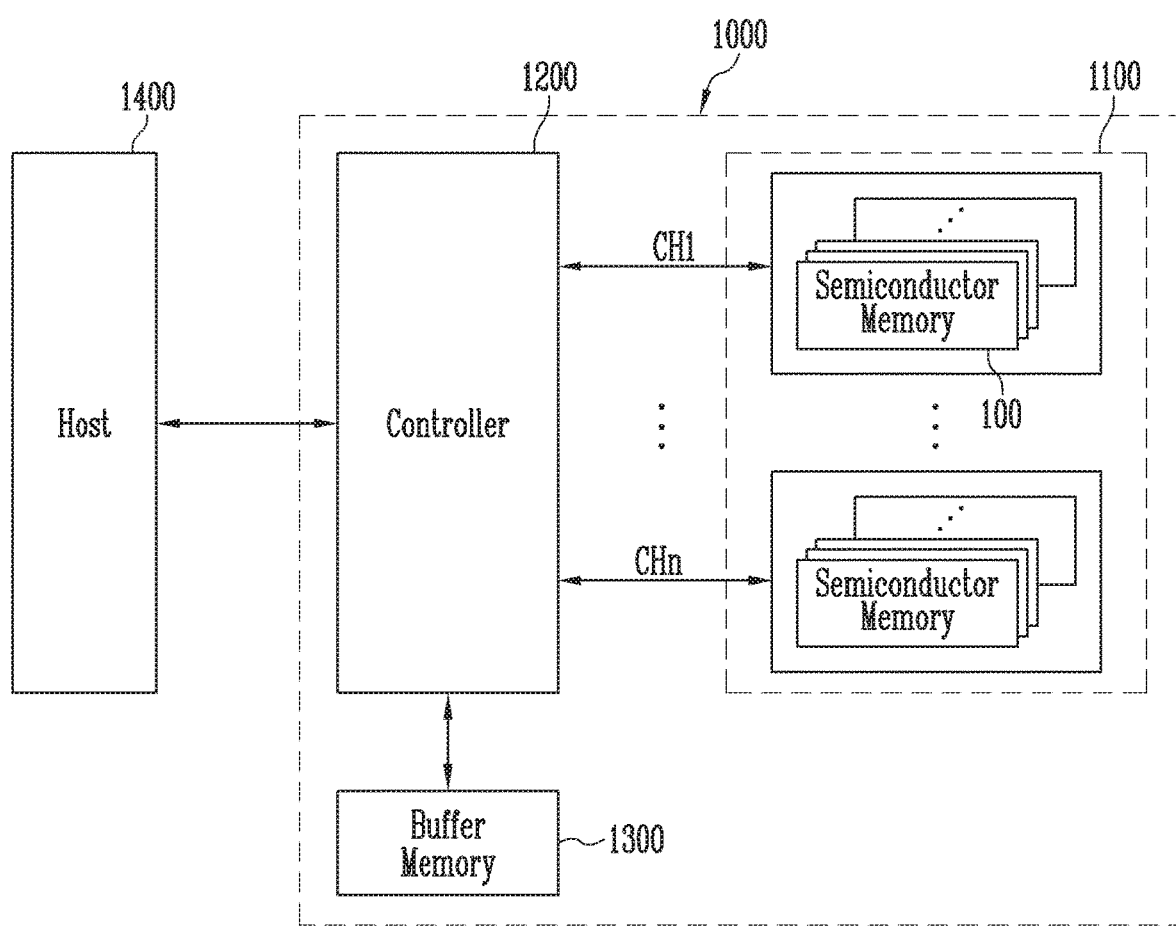
FIG. 1 is a block diagram illustrating a memory system in accordance with an embodiment of the present disclosure.

Specific structural and functional description presented herein is directed to embodiments of the present disclosure. The present invention, however, is not limited to either the specific description provided or any of the embodiments described.

While various embodiments are described in detail, the present invention is not limited to any of these embodiments. Rather, the present invention covers all alternatives, modifications, equivalents and other embodiments that fall within the spirit and scope of the present disclosure.

It will be understood that, although the terms "first", "second", etc. may be used herein to identify various elements, these elements should not be limited by these terms. These terms are only used to distinguish one element from another element that otherwise have the same names. For instance, a first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art is omitted to avoid obscuring the subject matter of the present disclosure. This aims to make the subject matter of the present disclosure clear.

Various embodiments of the present disclosure are described more fully below with reference to the accompanying drawings, in which preferred embodiments of the present disclosure are shown, so that those skilled in the art are able to practice the present invention. Throughout the specification, reference to "an embodiment," "another embodiment" or the like is not necessarily to only one embodiment, and different references to any such phrase are not necessarily to the same embodiment(s).

FIG. 1 is a block diagram illustrating a memory system 1000 in accordance with an embodiment of the present disclosure.

Referring to FIG. 1, the memory system 1000 may include a memory device 1100, a controller 1200, and a buffer memory 1300. The memory device 1100 may include a plurality of semiconductor memories 100. The plurality of semiconductor memories 100 may be divided into a plurality of groups.

In FIG. 1, it is illustrated that the plurality of groups, i.e., n groups, communicate with the controller 1200 through first to n-th channels CH1 to CHn, respectively. Each semiconductor memory 100 will be described in detail later herein with reference to FIG. 3.

All semiconductor memories in the same group may communicate with the controller 1200 through one common channel. The controller 1200 may control the plurality of semiconductor memories 100 of the memory device 1100 through the plurality of channels CH1 to CHn.

The controller 1200 is connected between a host 1400 and the memory device 1100. The controller 1200 may access the memory device 1100 in response to a request from the host 1400. For example, the controller 1200 may control a read operation, a program operation, an erase operation, and a background operation of the memory device 1100 in response to a command received from the host 1400. The controller 1200 may provide an interface between the memory device 1100 and the host 1400. The controller 1200 may run firmware for controlling the memory device 1100.

When a read command is received from the host 1400, the controller 1200 may determine whether the read command is a normal read command or an asynchronous read command, and perform a corresponding operation based on the determination. The asynchronous read command may be a read command corresponding to a plane interleaving operation or a cache read operation. For example, when the read command received from the host 1400 is a normal read command, storage space is allocated to the buffer memory 1300 to secure space to store read data before the read command is output to the memory device 1100, and thereafter the read command is output to the memory device 1100 so that a read operation is performed. Subsequently, when the memory device 1100 completes the read operation, the read data is received from the memory device 1100 and stored in the allocated storage space of the buffer memory 1300, and then the read data stored in the buffer memory 1300 is output to the host 1400.

When the read command received from the host 1400 is an asynchronous read command, the read command is output, before storage space is allocated to the buffer memory 1300, to the memory device 1100 so that the memory device 1100 performs a read operation. Thereafter, when the memory device 1100 completes the read operation, the storage space is allocated, immediately before the read data is received from the memory device 1100, to the buffer memory 1300 to secure space to store the read data. Subsequently, the read data is received from the memory device 1100 and stored in the allocated storage space of the buffer memory 1300, and then the read data stored in the buffer memory 1300 is output to the host 1400.

When a read operation is performed in response to a request from the host 1400, the buffer memory 1300 may temporarily store data read from the memory device 1100 and then output the data to the host 1400. When a program operation is performed, the buffer memory 1300 may temporarily store data received from the host 1400 and then output the data to the memory device 1100. FIG. 1 illustrates that the buffer memory 1300 is a component provided separately from the controller 1200, but in another embodiment the controller 1200 may include the buffer memory 1300.

The host 1400 may control the memory system 1000. The host 1400 may include a portable electronic device such as a computer, a personal digital assistant (PDA), a portable multimedia player (PMP), an MP3 player, a camera, a camcorder, or a mobile phone. The host 1400 may use a command to make a request for a read operation, a program operation, and an erase operation of the memory system 1000.

The controller 1200 and the memory device 1100 may be integrated into a single semiconductor device. In an embodiment, the controller 1200 and the memory device 1100 may be integrated into a single semiconductor device to form a memory card, such as a personal computer memory card international association (PCMCIA), a compact flash card (CF), a smart media card (e.g., SM or SMC), a memory stick multimedia card (e.g., MMC, RS-MMC, or MMCmicro), a secure digital (SD) card (e.g., SD, miniSD, microSD, or SDHC), or a universal flash storage (UFS).

In another embodiment, the controller 1200 and the memory device 1100 may be integrated into a single semiconductor device to form a solid state drive (SSD). The SSD may include a storage device configured to store data in a semiconductor memory. When the memory system 1000 is used as the SSD, the operating speed of the host 1400 coupled to the memory system 1000 may be greatly improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system.

In an embodiment, the memory device 1100 or the memory system 1000 may be embedded in various types of packages. For example, the memory device 1100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline integrated circuit (SOIC), Shrink Small Outline Package (SSOP), Thin Small Outline package (TSOP), Thin Quad Flatpack (TQFP), System In Package (SIP), Multi Chip Package (MCP), Wafer-level Fabricated Package (WFP), or Wafer-Level Processed Stack Package (WSP).

Figure 2:
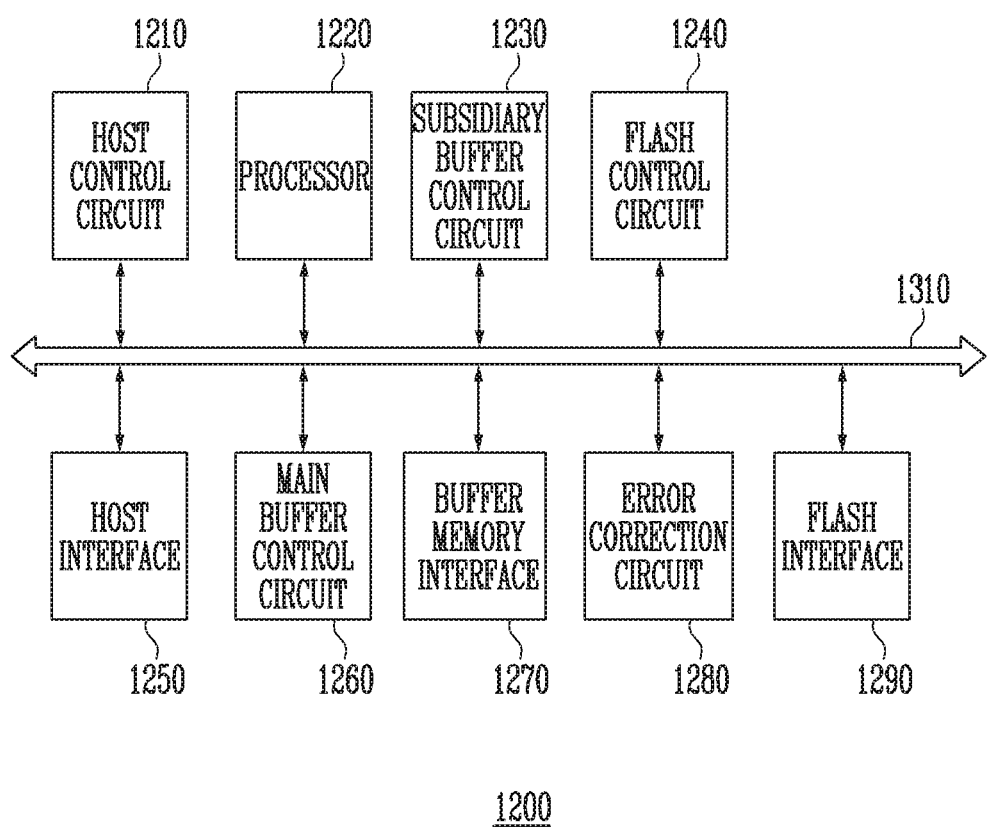
FIG. 2 is a block diagram illustrating a configuration of a controller in accordance with an embodiment of the present disclosure.

FIG. 2 is a diagram illustrating a controller, e.g., the controller 1200 of FIG. 1, in accordance with an embodiment of the present disclosure.

Referring to FIG. 2, the controller 1200 may include a host control circuit 1210, a processor 1220, a subsidiary buffer control circuit 1230, a flash control circuit 1240, a host interface 1250, a main buffer control circuit 1260, a buffer memory interface 1270, an error correction circuit 1280, a flash interface 1290, and a bus 1310.

The bus 1310 may provide a channel between the components of the controller 1200.

The host control circuit 1210 may control data transmission between the host 1400 of FIG. 1, the host interface 1250, and the buffer memory 1300 of FIG. 1. In an embodiment, during a write operation, the host control circuit 1210 may control an operation of buffering data received from the host 1400 to the buffer memory 1300 via the host interface 1250. In an embodiment, during a read operation, the host control circuit 1210 may control an operation of outputting data buffered to the buffer memory 1300 to the host 1400 via the host interface 1250.

The processor 1220 may control the overall operation of the controller 1200 and perform a logical operation. The processor 1220 may communicate with the host 1400 of FIG. 1 through the host interface 1250, and communicate with the memory device 1100 of FIG. 1 through the flash interface 1290. The processor 1220 may communicate with the buffer memory 1300 of FIG. 1 through the buffer memory interface 1270.

When a read request is received from the host 1400 of FIG. 1 through the host interface 1250, the processor 1220 may parse a command included in the received request and generate an internal command. Here, the generated internal command may be a normal read command or an asynchronous read command.

The processor 1220 may drive firmware, which is referred to as a flash translation layer (FTL), so as to control the overall operation of the controller 1200. The FTL may receive a logical block address (LBA) from the host 1400 and translate the LBA into a physical block address (PBA) using a mapping table. An address mapping method using the FTL may be modified in various ways depending on the unit of mapping. Representative address mapping methods include a page mapping method, a block mapping method, and a hybrid mapping method. Furthermore, the processor 1220 may parse a command received from the host 1400, generate an internal command, and generate a plurality of command queue by queuing the generated internal command according to the priority.

The mapping table may be stored in the memory device 1100, and may be read during a process of booting the memory system and stored in the buffer memory 1300.

When an asynchronous read operation is performed, the subsidiary buffer control circuit 1230 may allocate storage space to the buffer memory 1300 to secure space in which the read data is to be stored. In other words, when the command received from the host 1400 is parsed by the processor 1220 and an asynchronous read command is thus generated and queued as an internal command, the subsidiary buffer control circuit 1230 allocates storage space to the buffer memory 1300 to store read data of the memory device 1100 after the memory device 1100 completes the read operation in response to the asynchronous read command. For example, the subsidiary buffer control circuit 1230 may be included in the flash control circuit 1240 as a component of the flash control circuit 1240.

The flash control circuit 1240 may output a memory command for controlling a plurality of semiconductor memories 100 of the memory device 1100 in response to a plurality of command queues.

For example, the flash control circuit 1240 may be included in the processor 1220 as a component of the processor 1220.

The host interface 1250 may communicate with the host 1400 of FIG. 1 under control of the processor 1220. The host interface 1250 may perform communication using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and/or a load reduced DIMM (LRDIMM).

The main buffer control circuit 1260 may control the buffer memory 1300 under control of the processor 1220. During a program operation, the main buffer control circuit 1260 may allocate, to the buffer memory 1300, storage space in which program data received from the host 1400 is to be stored. Furthermore, when the command received from the host 1400 is parsed by the processor 1220 and a normal read command is thus generated and queued as an internal command, the main buffer control circuit 1260 may allocate, before the memory device 1100 performs the read operation, storage space in which data to be read is to be stored to the buffer memory 1300.

The buffer memory interface 1270 may communicate with the buffer memory 1300 of FIG. 1 under control of the processor 1220. The buffer memory interface 1270 may communicate a command, an address, and data with the buffer memory 1300 through a channel.

The error correction circuit 1280 may perform an error correction operation. The error correction circuit 1280 may perform an error correction code (ECC) encoding operation based on data to be written to the memory device 1100 of FIG. 1 through the flash interface 1290. ECC encoded data may be transmitted to the memory device 1100 through the flash interface 1290. The error correction circuit 1280 may perform an ECC decoding operation for data received from the memory device 1100 through the flash interface 1290.

For example, the error correction circuit 1280 may be included in the flash interface 1290 as a component of the flash interface 1290.

The flash interface 1290 may communicate with the memory device 1100 of FIG. 1 under control of the processor 1220. The flash interface 1290 may communicate control signals, an address, and data with the memory device 1100 through channels.

Figure 3:
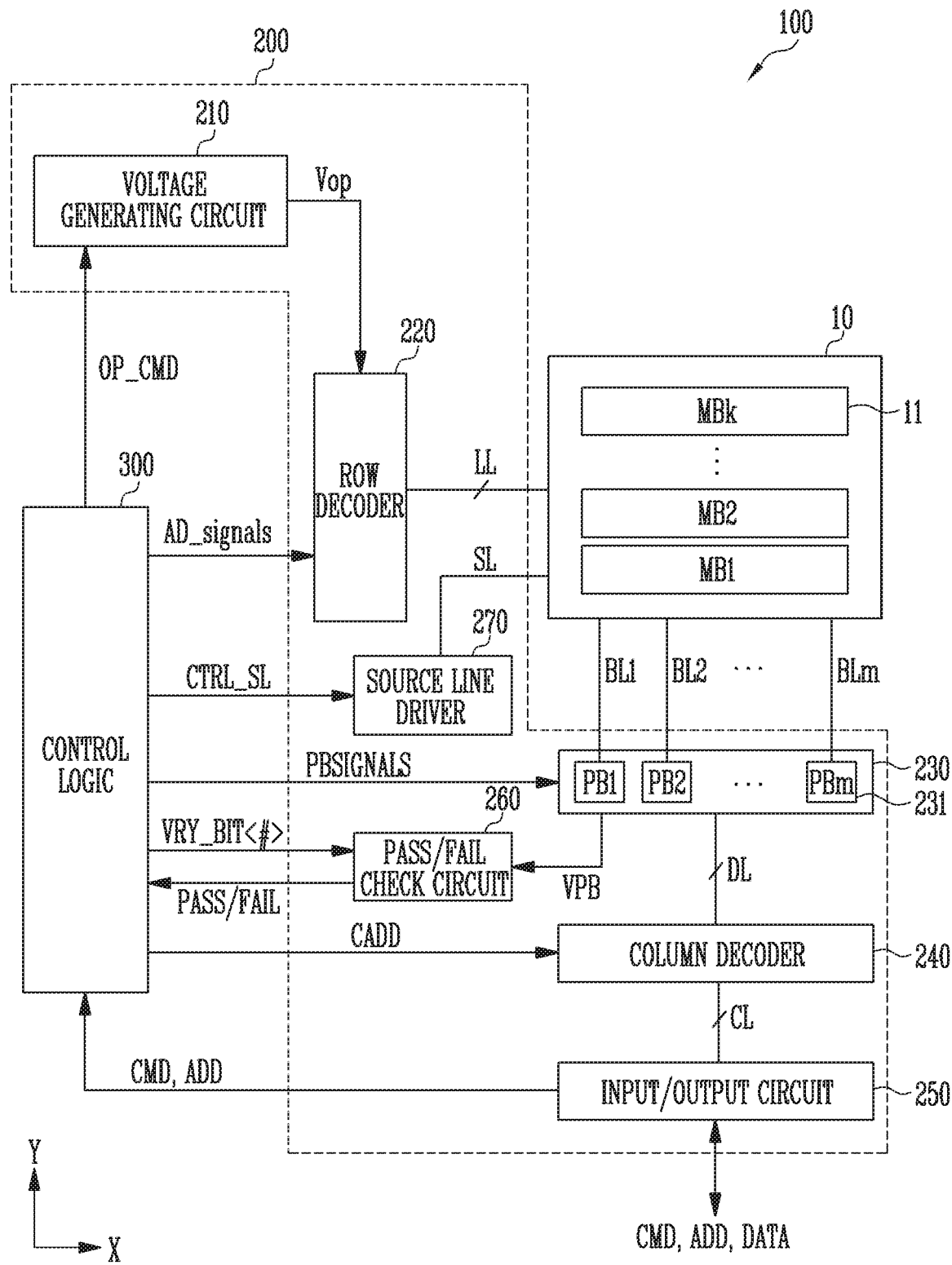
FIG. 3 is a diagram illustrating a semiconductor memory in accordance with an embodiment of the present disclosure.

FIG. 3 is a diagram illustrating a semiconductor memory, e.g., the semiconductor memory 100 of FIG. 1, in accordance with an embodiment of the present disclosure.

Referring to FIG. 3, the semiconductor memory 100 may include a memory cell array 10 configured to store data. The semiconductor memory 100 may include a peripheral circuit 200 configured to perform a program operation for storing data in the memory cell array 10, a read operation for outputting the stored data, and an erase operation for erasing the stored data. The semiconductor memory 100 may include control logic 300 configured to control the peripheral circuit 200 under control of a controller (e.g., the controller 1200 of FIG. 1).

The memory cell array 10 may include a plurality of memory blocks MB1 to MBk (where k is a positive integer). Local lines LL and bit lines BL1 to BLm (where m is a positive integer) may be coupled to each of the memory blocks MB1 to MBk. For example, the local lines LL may include a first select line, a second select line, and a plurality of word lines arranged between the first and the second select lines. The local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines SL. Further, the local lines LL may include dummy lines. Furthermore, the local lines LL may include pipelines. The local lines LL may be coupled to each of the memory blocks MB1 to MBk. The bit lines BL1 to BLm may be coupled in common to the memory blocks MB1 to MBk. The memory blocks MB1 to MBk may be embodied in a two- or three-dimensional structure. In a memory block 11 having a two-dimensional structure, the memory cells may be arranged in a direction parallel to a substrate. In a memory block 11 having a three-dimensional structure, the memory cells may be stacked in a direction perpendicular to the substrate.

The peripheral circuit 200 may perform a program operation, a read operation, or an erase operation on a selected memory block 11 under control of the control logic 300. For instance, the peripheral circuit 200 may include a voltage generating circuit 210, a row decoder 220, a page buffer group 230, a column decoder 240, an input and output (input/output) circuit 250, a pass and fail (pass/fail) check circuit 260, and a source line driver 270.

The voltage generating circuit 210 may generate various operating voltages Vop to be used for a program operation, a read operation, and an erase operation in response to an operating signal OP_CMD. Furthermore, the voltage generating circuit 210 may selectively discharge the local lines LL in response to the operating signal OP_CMD. For example, the voltage generating circuit 210 may generate a program voltage, a verify voltage, a pass voltage, and a select transistor operating voltage under control of the control logic 300. Furthermore, the voltage generating circuit 210 may generate first and second read voltages to monitor threshold voltages of the select transistors. In an embodiment, the second read voltage may be higher than the first read voltage.

The row decoder 220 may transmit operating voltages Vop to local lines LL coupled to a selected memory block 11 in response to row decoder control signals AD_signals1 and AD_signals2. The row decoder 220 may selectively apply operating voltages (e.g., a program voltage, a verify voltage, and a pass voltage) generated by the voltage generating circuit 210 to the word lines among the local lines LL in response to row decoder control signals AD_signals.

During a program voltage applying operation, in response to the row decoder control signals AD_signals, the row decoder 220 may apply the program voltage to a selected word line of the local lines LL, and apply the pass voltage to unselected word lines. During a read operation, in response to the row decoder control signals AD_signals, the row decoder 220 may apply the read voltage to a selected word line of the local lines LL, and apply the pass voltage to unselected word lines.

The page buffer group 230 may include a plurality of page buffers PB1 to PBm coupled to the bit lines BL1 to BLm. The page buffers PB1 to PBm may operate in response to page buffer control signals PBSIGNALS. For instance, one page buffer 231 of the page buffers PB1 to PBm may temporarily store data to be programmed during a program operation, or sense voltages or currents of the bit lines BL1 to BLm during a read or verify operation.

The column decoder 240 may transmit data between the input/output circuit 250 and the page buffer group 230 in response to a column address CADD. For example, the column decoder 240 may exchange data with the page buffers PB1 to PBm through data lines DL or exchange data with the input/output circuit 250 through column lines CL.

The input/output circuit 250 may transmit a memory command CMD or an address ADD received from a controller (e.g., the controller 1200 of FIG. 1) to the control logic 300, or exchange data with the column decoder 240.

During a read operation or a verify operation, the pass/fail check circuit 260 may generate a reference current in response to an enable bit VRY_BIT<#>. Further, the pass/fail check circuit 260 may compare a sensing voltage VPB received from the page buffer group 230 with a reference voltage generated by the reference current and output a pass signal PASS or a fail signal FAIL.

The source line driver 270 may be coupled, through the source line SL, to the memory cells included in the memory cell array 10, and may control a voltage to be applied to the source line SL. The source line driver 270 may receive a source line control signal CTRL_SL from the control logic 300, and control a source line voltage to be applied to the source line SL based on the source line control signal CTRL_SL.

The control logic 300 may output an operating signal OP_CMD, a row decoder control signal AD_signals, page buffer control signals PBSIGNALS, and an enable bit VRY_BIT<#> in response to a memory command CMD and an address ADD, and thus control the peripheral circuit 200. In addition, the control logic 300 may determine whether a target memory cell has passed a verification during a verify operation in response to a pass signal PASS or a fail signal FAIL.

Figure 4:
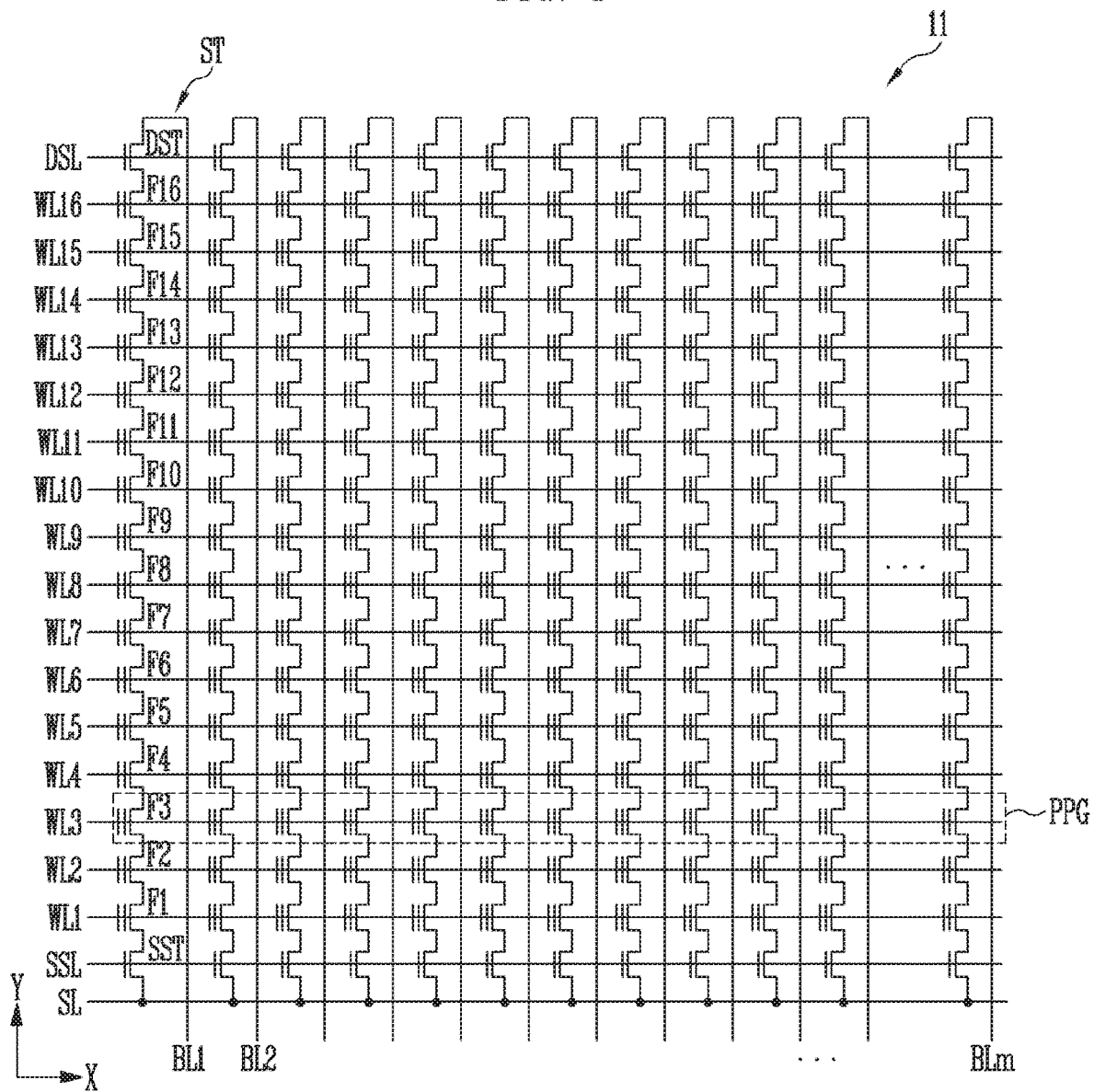
FIG. 4 is a diagram illustrating a memory block in accordance with an embodiment of the present disclosure.

FIG. 4 is a diagram illustrating a memory block, e.g., a memory block 11 of FIG. 3, in accordance with an embodiment of the present disclosure.

Referring to FIG. 4, in the memory block 11, a plurality of word lines arranged parallel to each other may be coupled between a first select line and a second select line. Here, the first select line may be a source select line SSL, and the second select line may be a drain select line DSL. In more detail, the memory block 11 may include a plurality of strings ST coupled between the bit lines BL1 to BLm and the source line SL. The bit lines BL1 to BLm may be respectively coupled to the strings ST, and the source lines SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and more than the 16 memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to each word line may be referred to as a physical page PPG. Therefore, the number of physical pages PPG included in the memory block 11 may correspond to the number of word lines WL1 to WL16.

Each memory cell may store 1-bit data. This memory cell is typically called a single level cell (SLC). In this case, each physical page PPG may store data of a singe logical page LPG. Data of each logical page LPG may include data bits corresponding to the number of cells included in a single physical page PPG. Each memory cell may store 2- or more-bit data. This memory cell is typically called a multi-level cell (MLC). In this case, each physical page PPG may store data of two or more logical pages LPG.

Figure 5:
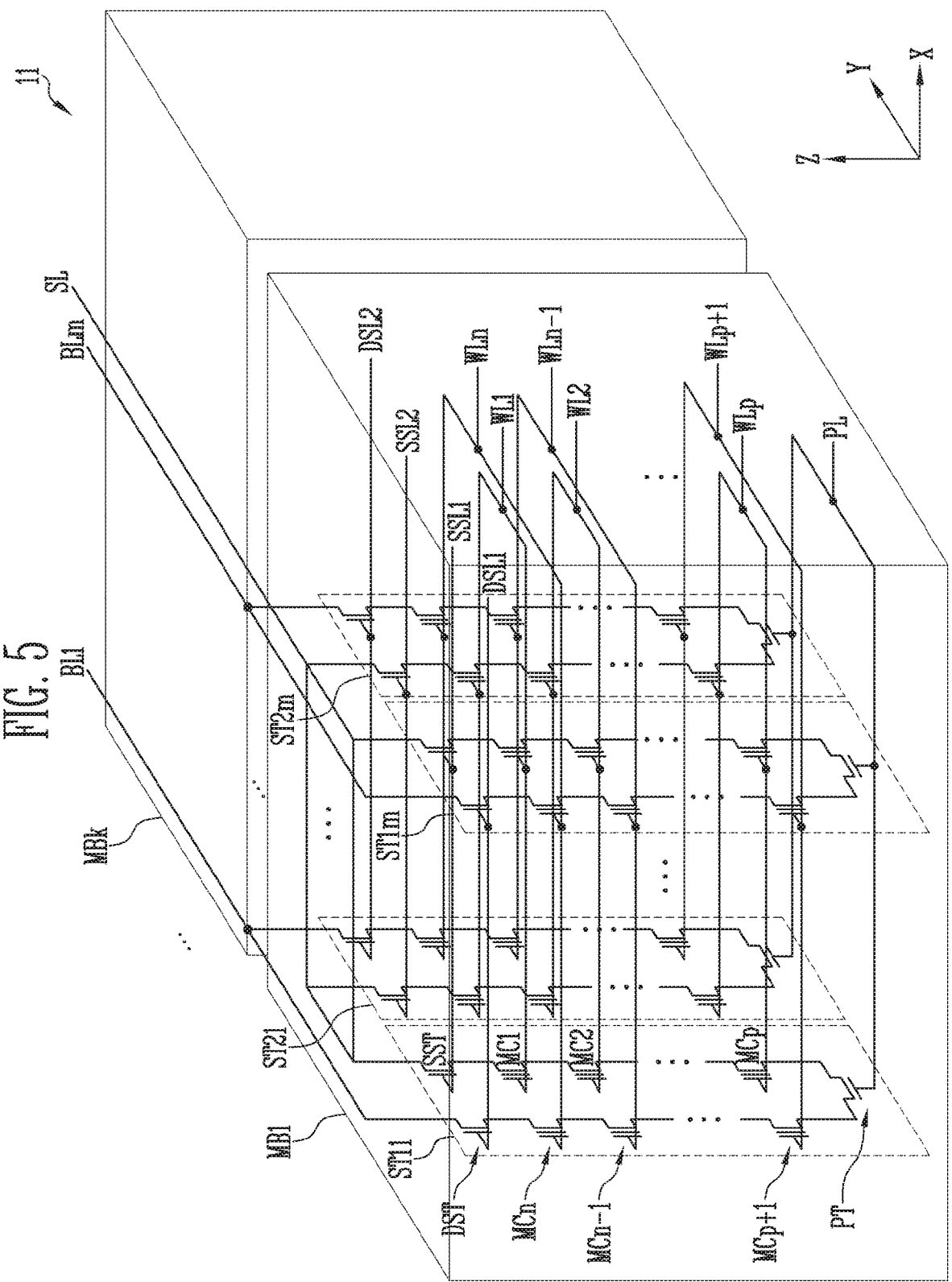
FIG. 5 is a diagram illustrating a memory block having a three-dimensional structure in accordance with an embodiment of the present disclosure.

FIG. 5 is a diagram illustrating a memory block 11 having a three-dimensional structure in accordance with an embodiment of the present disclosure.

Referring to FIG. 5, the memory block 11 may be any of the plurality of memory blocks MB1 to MBk in the memory cell array 10 of FIG. 3. The memory block 11 may include a plurality of strings ST11 to ST1m and ST21 to ST2m. In an embodiment, each of the strings ST11 to ST1m and ST21 to ST2m may be formed in a 'U' shape. In the memory block MB11, m strings may be arranged in a row direction (i.e. an X direction). Although FIG. 5 illustrates that two strings are arranged in a column direction (i.e., a Y direction), this is for clarity; three or more strings may be arranged in the column direction (i.e., the Y direction).

Each of the plurality of strings ST11 to ST1m and ST21 to ST2m may include at least one source select transistor SST, first to n-th memory cells MC1 to MCn, a pipe transistor PT, and at least one drain select transistor DST.

The source select transistor SST, the drain select transistor DST, and the memory cells MC1 to MCn may have structures similar to each other. Each of the source select transistor SST, the drain select transistor DST, and the memory cells MC1 to MCn may include a channel layer, a tunnel insulating layer, a charge trap layer, and a blocking insulating layer. For example, a pillar for providing the channel layer may be provided in each string. For another example, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCn.

In an embodiment, source select transistors of strings arranged in the same row may be coupled to a source select line extending in the row direction. Source select transistors of strings arranged in different rows may be coupled to different source select lines. In FIG. 5, source select transistors of the strings ST11 to ST1m in a first row may be coupled to a first source select line SSL1. Source select transistors of the strings ST21 to ST2m in a second row may be coupled to a second source select line SSL2.

In an embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be successively arranged in a vertical direction (i.e., a Z direction) and coupled in series to each other between the source select transistor SST and the pipe transistor PT. The (p+1)-th to n-th memory cells MCp+1 to MCn may be successively arranged in the vertical direction (i.e., the Z direction) and coupled in series to each other between the pipe transistor PT and the drain select transistor DST. The first to p-th memory cells MC1 to MCp and the (p+1)-th to n-th memory cells MCp+1 to MCn may be coupled to each other through the pipe transistor PT. Gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Gates of the pipe transistors PT of the respective strings may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1m in the first row may be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 5, the strings ST11 and ST21 in a first column may be coupled to a first bit line BL1. The strings ST1m and ST2m in an m-th column may be coupled to an m-th bit line BLm.

Among the strings arranged in the row direction, memory cells coupled to the same word line may form one page. For example, memory cells coupled to the first word line WL1 in the strings ST11 to ST1m of the first row may form a single page. Memory cells coupled to the first word line WL1 in the strings ST21 to ST2m of the second row may form another single page. When any one of the drain select lines DSL1 and DSL2 is selected, strings arranged in the corresponding row may be selected. When any one of the word lines WL1 to WLn is selected, a corresponding single page may be selected from the selected strings.

Figure 6:
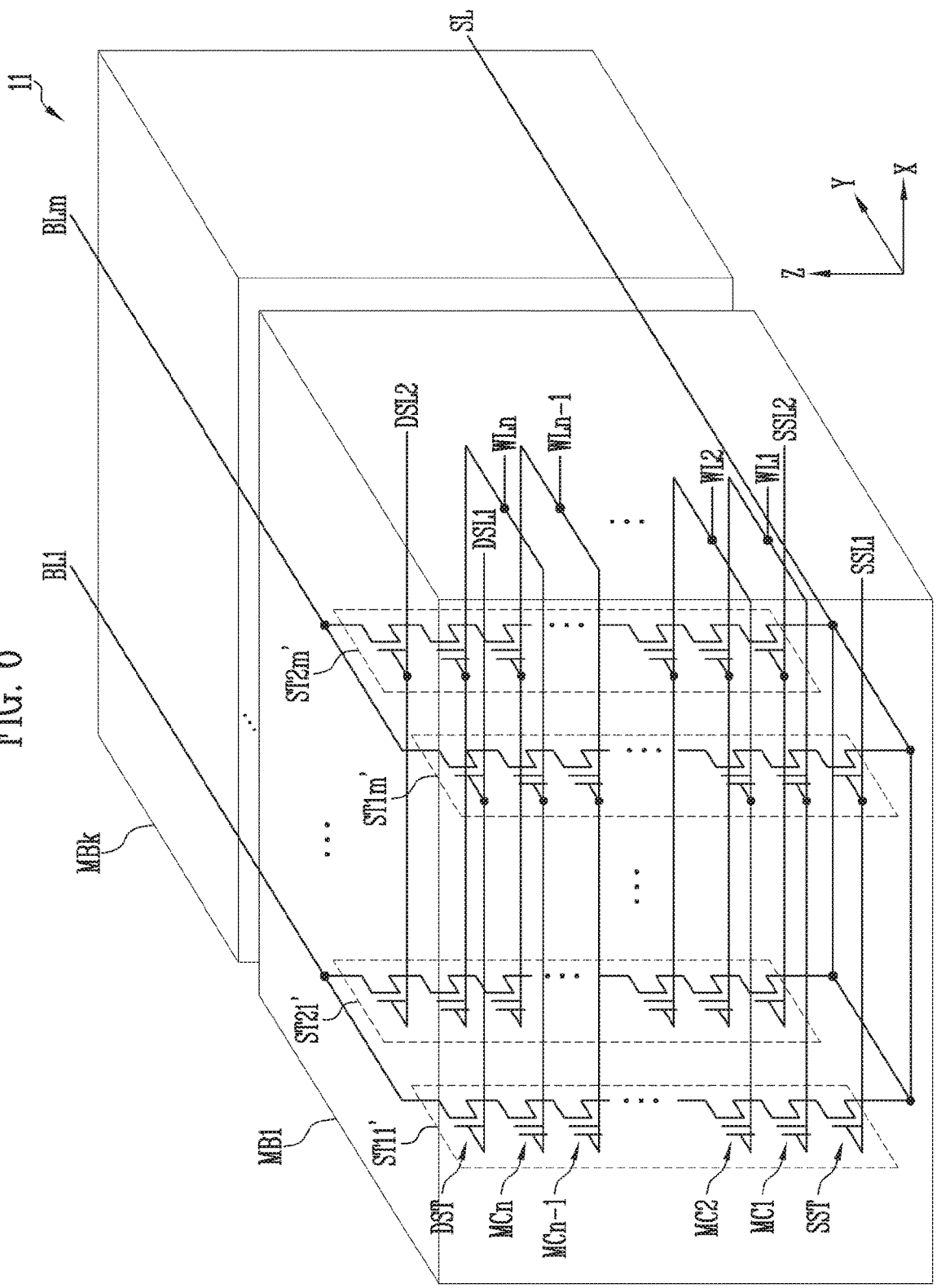
FIG. 6 is a diagram illustrating a memory block having a three-dimensional structure in accordance with another embodiment of the present disclosure.

FIG. 6 is a diagram illustrating a memory block 11 having a three-dimensional structure in accordance with another embodiment of the present disclosure.

Referring to FIG. 6, the memory block 11 may be any of the plurality of memory blocks MB1 to MBk in the memory cell array 10 of FIG. 3. The memory block 11 may include a plurality of strings ST11' to ST1m' and ST21' to ST2m'. Each of the strings ST11' to ST1m' and ST21' to ST2m' may extend in a vertical direction (i.e., a Z direction). In each memory block 11, m strings may be arranged in a row direction (i.e., an X direction). Although FIG. 6 illustrates that two strings are arranged in a column direction (i.e., a Y direction), this is for clarity; three or more strings may be arranged in the column direction (i.e., the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Thereby, the reliability of data stored in the memory block 11 may be improved.

The drain select transistor DST of each string may be coupled between the corresponding bit line and the memory cells MC1 to MCn. Drain select transistors DST of strings arranged in the row direction may be coupled to corresponding drain select lines extending in the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

Figure 7:
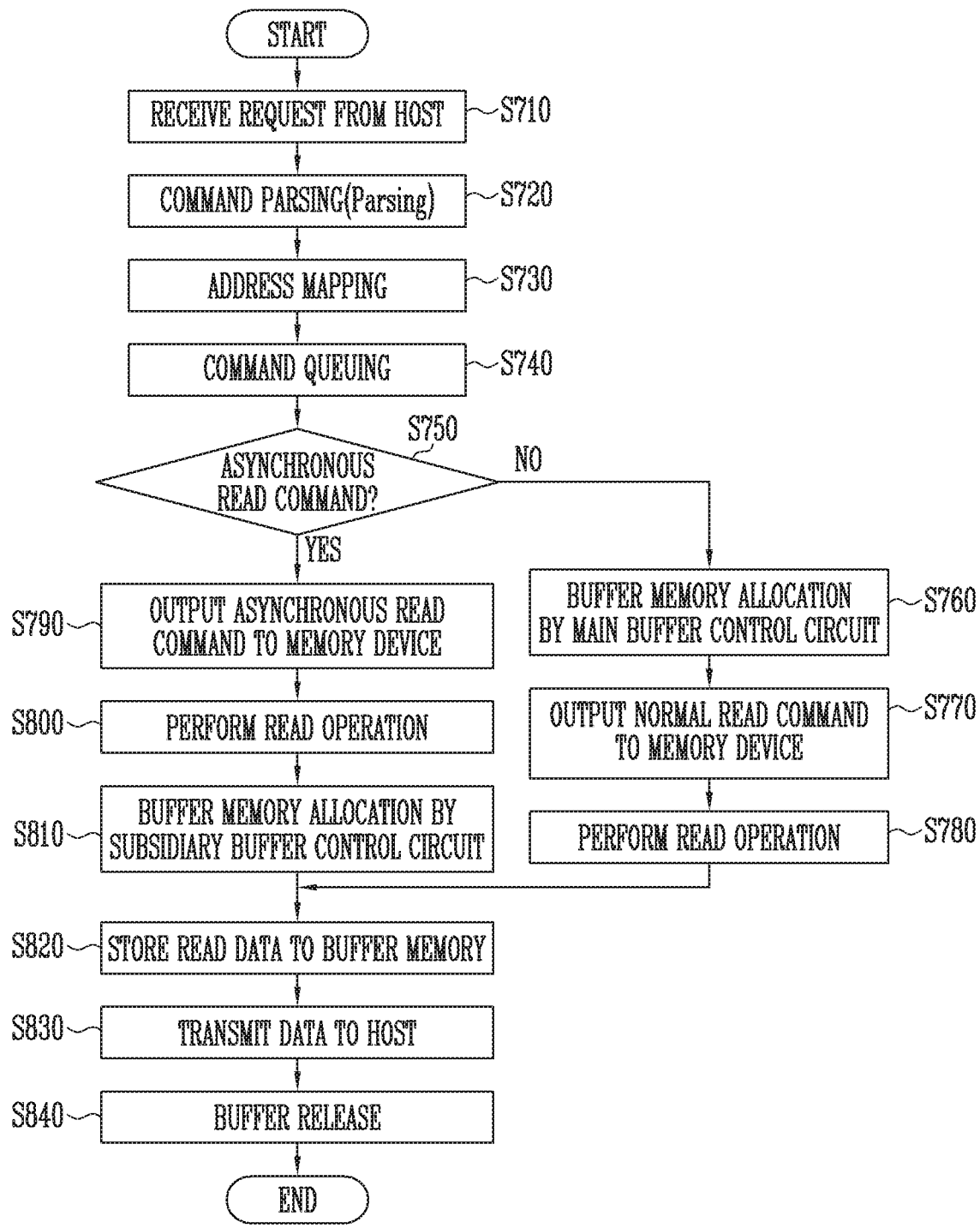
FIG. 7 is a flowchart illustrating a method of operating a memory system in accordance with an embodiment of the present disclosure.

FIG. 7 is a flowchart illustrating a method of operating a memory system in accordance with an embodiment of the present disclosure.

The method of FIG. 7 is described with additional reference to FIGS. 1 to 6.

By way of example, the case where a read request is received from the host 1400 of FIG. 1 during the operation of the memory system 1000 is described.

Referring to FIG. 7, when a read request is received from the host 1400 through the host interface 1250 (step S710), the processor 1220 of the controller 1200 parses a command included in the received request (step S720). The processor 1220 drives the FTL and performs an address mapping operation by translating a logical block address received from the host 1400 into a physical block address (step S730). The processor 1220 generates an internal command for controlling the memory device 1100 based on a result of the parsing, and queues the generated internal command according to the priority, thus generating a plurality of queued commands (step S740).

The processor 1220 determines at step S750 whether the generated internal command is an asynchronous read command.

If it is determined that the internal command is not an asynchronous read command and thus is a normal read command (S750, "NO"), the processor 1220 controls the main buffer control circuit 1260 and allocates before the memory device 1100 performs a read operation, storage space in which data to be read is to be stored to the buffer memory 1300, at step S760.

Thereafter, at step S770, the flash control circuit 1240 generates a memory command CMD in response to the internal command (i.e., the normal read command) queued in a command queue and outputs the memory command CMD to the memory device 1100.

At step S780, a selected semiconductor memory 100, among the plurality of semiconductor memories 100 in the memory device 1100, performs a read operation in response to the memory command CMD and the address ADD from the controller 1200.

After completing the read operation at step S780, the semiconductor memory 100 outputs read data to the controller 1200. At step S820, the buffer memory interface 1270 of the controller 1200 controls the buffer memory 1300 such that the read data received from the memory device 1100 is stored in the storage area allocated to the buffer memory 1300.

The read data stored in the buffer memory 1300 is transmitted to the host 1400 at step S830. When such transmitting operation is completed, at step S840, the buffer memory 1300, or allocated storage area thereof, is released. In other words, the data stored in the storage area allocated in the buffer memory 1300 is deleted or erased.

Returning to step S750, if it is determined that the internal command is an asynchronous read command (S750, "YES"), the flash control circuit 1240 generates a memory command CMD in response to an internal command (i.e., the asynchronous read command) queued in the command queue and outputs the memory command CMD to the memory device 1100, at step S790.

At step S800, a selected semiconductor memory 100, among the plurality of semiconductor memories 100 included in the memory device 1100, performs a read operation in response to the memory command CMD and the address ADD from the controller 1200.

When the read operation of the selected semiconductor memory 100 is completed, at step S810, the subsidiary buffer control circuit 1230 allocates storage space in which the read data to be transmitted from the selected semiconductor memory 100 is to be stored to the buffer memory 1300.

After completing the read operation at step S800, the semiconductor memory 100 of the memory device 1100 outputs the read data to the controller 1200. At step S820, the buffer memory interface 1270 controls the buffer memory 1300 such that the read data received from the memory device 1100 is stored in the storage area allocated to the buffer memory 1300. Subsequently, the read data stored in the buffer memory 1300 is transmitted to the host 1400 at step S830. When such transmitting operation is completed, at step S840, the buffer memory 1300, or allocated storage area thereof, is released such that the data stored therein is deleted or erased.

As described above, in various embodiments of the present disclosure, when a read request received from the host 1400 corresponds to an asynchronous read operation, an internal command is output to the memory device 1100 so that storage space is allocated to the buffer memory 1300 after the read operation has been performed. As such, since the storage space is allocated to the buffer memory 1300 immediately before the read data is received, the buffer memory 1300 may be efficiently used without latency.

Furthermore, in accordance with embodiments of the invention, the main buffer control circuit 1260 is configured to allocate storage space to the buffer memory 1300 in connection with a normal read operation. Still further, in accordance with embodiments of the invention, the subsidiary buffer control circuit 1230 is configured to allocate storage space to the buffer memory 1300 in connection with an asynchronous read operation. Consequently, storage space may be efficiently allocated to the buffer memory 1300.

Figure 8:
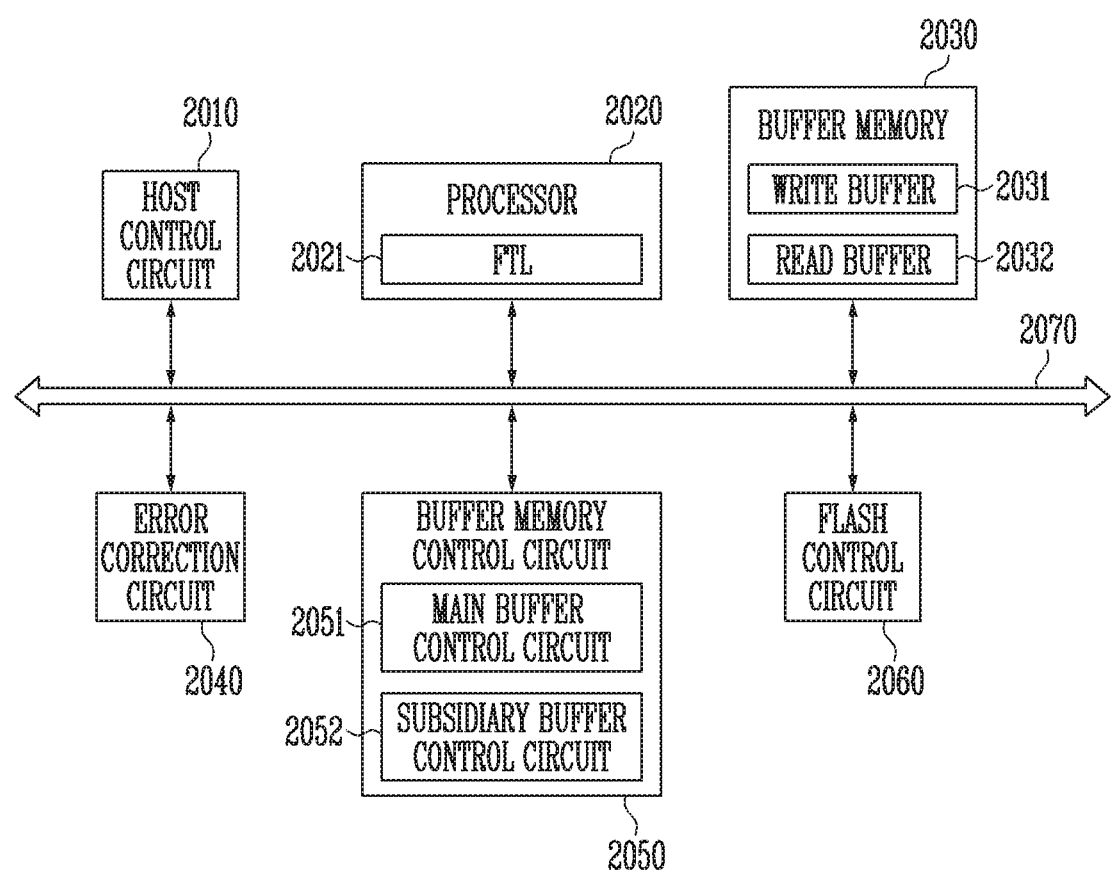
FIG. 8 is a block diagram illustrating a configuration of a controller in accordance with an embodiment of the present disclosure.

FIG. 8 is a block diagram illustrating a configuration of a controller, e.g., the controller 1200 of FIG. 1, in accordance with an embodiment of the present disclosure.

Referring to FIG. 8, the controller 1200 may include a host control circuit 2010, a processor 2020, a buffer memory 2030, an error correction circuit 2040, a buffer memory control circuit 2050, a flash control circuit 2060, and a bus 2070.

The bus 2070 may provide a channel between the components of the controller 1200.

The host control circuit 2010 may control data transmission between a host (e.g., the host 1400 of FIG. 1) and the buffer memory 2030. For example, the host control circuit 2010 may control an operation of buffering data received from the host 1400 to the buffer memory 2030. In an embodiment, the host control circuit 2010 may control an operation of outputting data buffered in the buffer memory 2030 to the host 1400. The host control circuit 2010 may include a host interface.

The processor 2020 may control the overall operation of the controller 1200 and perform a logical operation. The processor 2020 may communicate with the host 1400 through the host control circuit 2010, and communicate with a memory device (e.g., the memory device 1100 of FIG. 1) through the flash control circuit 2060. The processor 2020 may control the operation of the memory system 1000 by using the buffer memory 2030 as an operation memory, a cache memory, or a buffer. When a read request is received from the host 1400 through the host control circuit 2010, the processor 2020 may parse a command included in the received request and generate an internal command. Here, the generated internal command may be classified into a normal read command and an asynchronous read command.

The processor 2020 may include a flash translation layer (FTL) 2021. The FTL 2021 may drive firmware. The firmware may be stored in an additional memory (not illustrated) directly coupled to the buffer memory 2030 or the processor 2020. Alternatively, the firmware may be stored in a storage space defined in the processor 2020. The FTL may receive a logical block address (LBA) from the host 1400 and translate the LBA into a physical block address (PBA) using a mapping table. An address mapping method using the FTL may be modified in various ways depending on the unit of mapping. Representative address mapping methods include a page mapping method, a block mapping method, and a hybrid mapping method. Furthermore, the processor 2020 may parse a command received from the host 1400 and generate an internal command, and may generate a plurality of queued commands by queuing the generated internal command with respect to other commands according to the priority.

When a read operation is performed in response to a request from the host 1400, the buffer memory 2030 may temporarily store data read from the memory device 1100 and then output the data to the host 1400. When a program operation is performed, the buffer memory 2030 may temporarily store data received from the host 1400 and then output the data to the memory device 1100.

The buffer memory 2030 may be used as an operation memory, a cache memory, or a buffer of the processor 2020. The buffer memory 2030 may store codes and commands to be executed by the processor 2020. When a read operation is performed in response to a request from the host 1400, the buffer memory 2030 may temporarily store data read from the memory device 1100 and then output the data to the host 1400. When a program operation is performed, the buffer memory 2030 may temporarily store data received from the host 1400 and then output the data to the memory device 1100.

The buffer memory 2030 may include a write buffer 2031 and a read buffer 2032. During a program operation, the write buffer 2031 may temporarily store data received from the host 1400, and then transmit the temporarily stored data to the memory device 1100. During a read operation, the read buffer 2032 may temporarily store data received from the memory device 1100, and then transmit the temporarily stored data to the host 1400. The buffer memory 2030 may include a static RAM (SRAM) or a dynamic RAM (DRAM).

The error correction circuit 2040 may perform an error correction operation. The error correction circuit 2040 may perform an error correction code (ECC) encoding operation based on data to be written to the memory device 1100 through the flash control circuit 2060. ECC encoded data may be transmitted to the memory device 1100 through the flash control circuit 2060. The error correction circuit 2040 may perform an ECC decoding operation for data received from the memory device 1100 through the flash control circuit 2060. For example, the error correction circuit 2040 may be included in the flash control circuit 2060 as a component of the flash control circuit 2060.

The buffer memory control circuit 2050 may include main buffer control circuit 2051 and a subsidiary buffer control circuit 2052.

In connection with a program operation, the main buffer control circuit 2051 may allocate storage space in which program data received from the host 1400 is to be stored to the write buffer 2031 of the buffer memory 2030. When it is determined that the command received from the host 1400 is a normal read command, the main buffer control circuit 2051 may allocate storage space in which data to be read is to be stored to the read buffer 2032 before the memory device 1100 performs the read operation.

When it is determined that the command received from the host 1400 is an asynchronous read command, the subsidiary buffer control circuit 2052 may allocate storage space in which the read data is to be stored to the read buffer 2032 after the memory device 1100 has completed the read operation in response to the asynchronous read command. In other words, when an asynchronous read command is generated and queued as a result of parsing, by the processor 2020, the command received from the host 1400, the subsidiary buffer control circuit 2052 allocates storage space to the read buffer 2032 to store the data read by the memory device 1100 after the memory device 1100 completes the read operation in response to an internal command corresponding to the asynchronous read command.

For example, the buffer memory control circuit 2050 may be included in the processor 2020.

The flash control circuit 2060 may generate and output a memory command for controlling the memory device 1100 in response to a command queue generated by the processor 2020. During a program operation, the flash control circuit 2060 may control an operation of transmitting and programming data buffered in the write buffer 2031 of the buffer memory 2030 to the memory device 1100. During a read operation, the flash control circuit 2060 may control an operation of buffering, in the read buffer 2032 of the buffer memory 2030, data read from the memory device 1100 in response to a command queue. The flash control circuit 2060 may include a flash interface.

Figure 9:
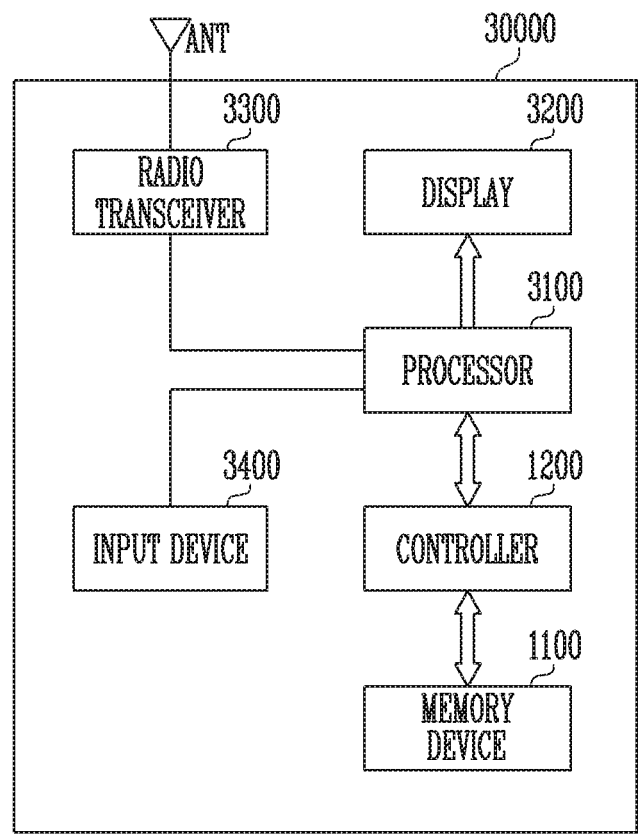
FIG. 9 is a diagram illustrating a memory system in accordance with an embodiment of the present disclosure.

FIG. 9 is a diagram illustrating a memory system 30000 in accordance with an embodiment of the present disclosure.

Referring to FIG. 9, the memory system 30000 may be embodied in a cellular phone, a smartphone, a tablet personal computer (PC), a personal digital assistant (PDA) or a wireless communication device. The memory system 30000 may include a memory device 1100, and a controller 1200 capable of controlling the operation of the memory device 1100. The controller 1200 may control a data access operation, e.g., a program operation, an erase operation, or a read operation, of the memory device 1100 under control of a processor 3100.

Data programmed to the memory device 1100 may be output through a display 3200 under control of the controller 1200.

The controller 1200 may form a super block using some memory blocks of a plurality of memory blocks included in the memory device 1100.

A radio transceiver 3300 may transmit and receive radio signals through an antenna ANT. For example, the radio transceiver 3300 may convert a radio signal received through the antenna ANT into a signal capable of being processed in the processor 3100. Therefore, the processor 3100 may process a signal output from the radio transceiver 3300 and transmit the processed signal to the controller 1200 or the display 3200. The controller 1200 may program a signal processed by the processor 3100 to the memory device 1100. Furthermore, the radio transceiver 3300 may convert a signal output from the processor 3100 into a radio signal, and output the radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the controller 1200, data output from the radio transceiver 3300, or data output form the input device 3400 is output through the display 3200.

In an embodiment, the controller 1200 capable of controlling the operation of the memory device 1100 may be embodied as a part of the processor 3100 or a chip provided separately from the processor 3100. Furthermore, the controller 1200 may be implemented using an example of the controller illustrated in FIG. 2 or 8.

Figure 10:
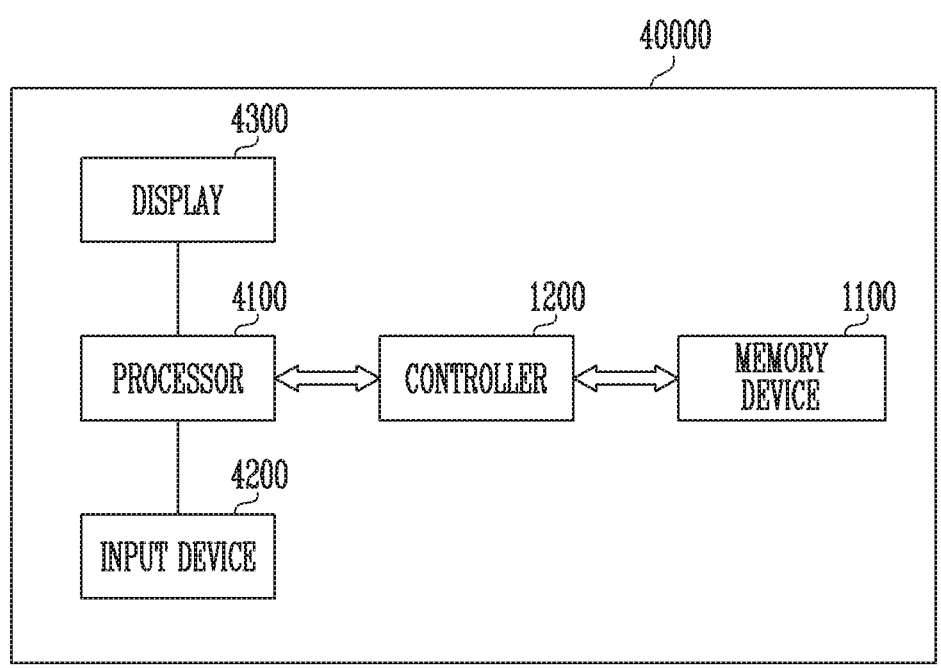
FIG. 10 is a diagram illustrating a memory system in accordance with an embodiment of the present disclosure.

FIG. 10 is a diagram illustrating a memory system 40000 in accordance with an embodiment of the present disclosure.

Referring to FIG. 10, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and a controller 1200 capable of controlling a data processing operation of the memory device 1100.

The controller 1200 may form a super block using some memory blocks of a plurality of memory blocks included in the memory device 1100.

A processor 4100 may output data stored in the memory device 1100 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the controller 1200. In an embodiment, the controller 1200 capable of controlling the operation of the memory device 1100 may be embodied as a part of the processor 4100 or a chip provided separately from the processor 4100. Furthermore, the controller 1200 may be implemented using an example of the controller illustrated in FIG. 2 or 8.

Figure 11:
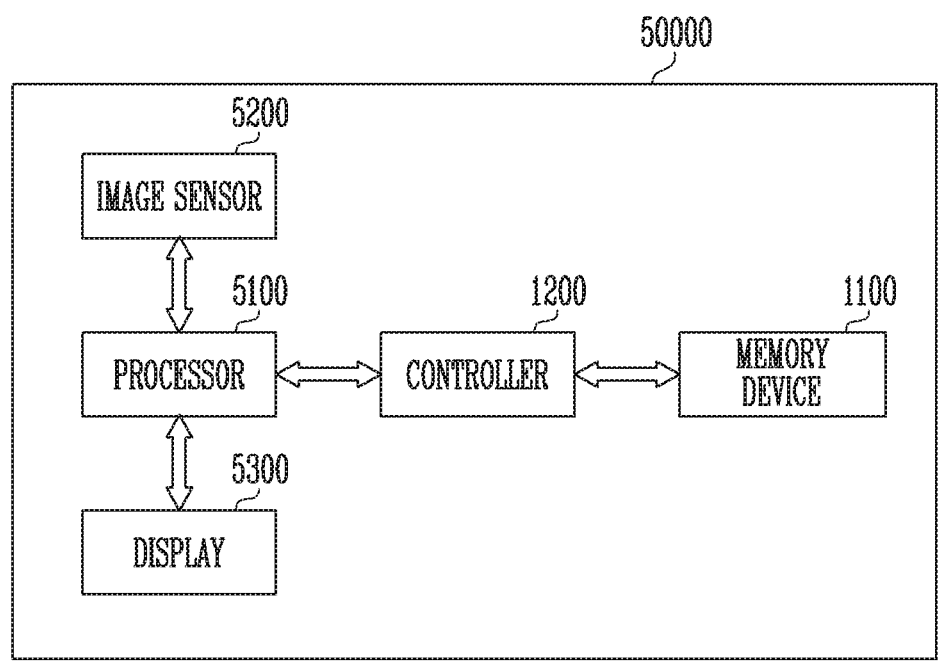
FIG. 11 is a diagram illustrating a memory system in accordance with an embodiment of the present disclosure.

FIG. 11 is a diagram illustrating a memory system 50000 in accordance with an embodiment of the present disclosure.

Referring to FIG. 11, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100, and a controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored to the memory device 1100 through the controller 1200. Data stored in the memory device 1100 may be output through the display 5300 under control of the processor 5100 or the controller 1200.

The controller 1200 may form a super block using some memory blocks of a plurality of memory blocks included in the memory device 1100.

In an embodiment, the controller 1200 capable of controlling the operation of the memory device 1100 may be embodied as a part of the processor 5100 or a chip provided separately from the processor 5100. Furthermore, the controller 1200 may be implemented using an example of the controller illustrated in FIG. 2 or 8.

Figure 12:
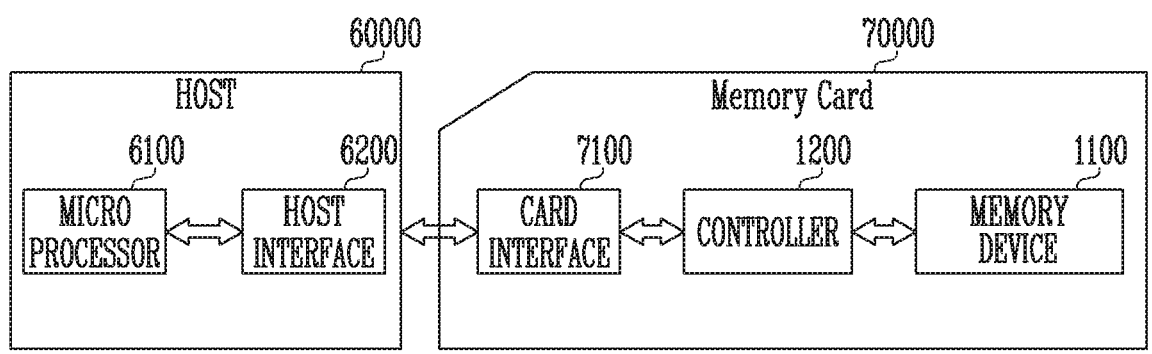
FIG. 12 is a diagram illustrating a memory system in accordance with an embodiment of the present disclosure.

FIG. 12 is a diagram illustrating a memory system 70000 in accordance with an embodiment of the present disclosure.

Referring to FIG. 12, the memory system 70000 may be embodied in a memory card or a smart card. The memory system 70000 may include a memory device 1100, a controller 1200, and a card interface 7100.

The controller 1200 may form a super block using some memory blocks of a plurality of memory blocks included in the memory device 1100.

The controller 1200 may control data exchange between the memory device 1100 and the card interface 7100. In an embodiment, the card interface 7100 may be a secure digital (SD) card interface or a multi-media card (MMC) interface, but it is not limited thereto. Furthermore, the controller 1200 may be implemented using an example of the controller 1200 illustrated in FIG. 2 or 8.

The card interface 7100 may interface data exchange between a host 60000 and the controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the controller 1200 under control of a microprocessor 6100.

As described above, in a memory system in accordance with embodiments of the present disclosure, after a read operation of a memory device has been completed, storage space for storing read data is allocated to a buffer memory. Consequently, the efficiency of using the buffer memory may be improved.

Although embodiments of the present invention have been disclosed, those skilled in the art will appreciate in light of the present disclosure that various modifications, additions and substitutions are possible, without departing from the scope and spirit of the present invention.

Therefore, the scope of the present invention is defined by the appended claims and equivalents thereof, rather than by the description preceding them.

In the above-discussed embodiments, in some cases one or more steps may be selectively performed or skipped. In addition, the steps may not be always performed in regular order. Furthermore, the embodiments disclosed herein aim to help those with ordinary knowledge in this art more clearly understand the present invention rather than aiming to limit the bounds of the present invention. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present invention without limiting the subject matter thereof. It should be understood that many variations and modifications of the basic inventive concept described herein still fall within the spirit and scope of the present invention as defined in the appended claims and their equivalents.

What is claimed is:

1. A memory system comprising:
   a memory device configured to store data through a write operation and output the stored data as read data through a read operation;
   a buffer memory configured to store the read data output from the memory device; and
   a controller configured to control the memory device such that the memory device performs the read operation in response to a read request received from a host, and to control the buffer memory such that the read data is stored in the buffer memory,
   wherein, when the read request corresponds to an asynchronous read operation as the read operation, the controller allocates a partial is area of the buffer memory as storage space for the read data after the read operation of the memory device is completed.

2. The memory system according to claim 1,
wherein the controller parses the read request, and generates and queues an internal command, and
wherein, when the internal command is an asynchronous read command corresponding to the asynchronous read operation, the asynchronous read command is output to the memory device before the storage space is allocated to the buffer memory.

3. The memory system according to claim 2, wherein, when the read request corresponds to a normal read operation as the read operation, the controller allocates the storage space to the buffer memory, and controls the memory device such that the memory device performs the normal read operation.

4. The memory system according to claim 3, wherein, when the internal command is a normal read command corresponding to the normal read operation, the controller outputs the normal read command to the memory device after the storage space is allocated to the buffer memory.

5. The memory system according to claim 3, wherein the controller comprises:
a processor configured to generate the internal command by parsing the read request, and generate a command queue by queuing the internal command;
a main buffer control circuit configured to allocate the storage space for storing the read data to the buffer memory for the normal read operation;
a flash control circuit configured to generate a memory command in response to the command queue, and output the generated memory command to the memory device; and
a subsidiary buffer control circuit configured to allocate the storage space to the buffer memory for the asynchronous read operation.

6. The memory system according to claim 5, wherein the subsidiary buffer control circuit allocates the storage space to the buffer memory after the read operation of the memory device is completed.

7. The memory system according to claim 1, wherein the asynchronous read operation includes a plane interleaving operation or a cache read operation.

8. A memory system comprising:
a memory device configured to store data, read stored data and output read data;
a buffer memory configured to store read data received from the memory device; and
a controller configured to control the memory device such that the memory device performs a read operation in response to a read request received from a host,
wherein the controller comprises:
a processor configured to generate the internal command by parsing the read request, and generate a command queue by queuing the generated internal command;
a flash control circuit configured to output a memory command to the memory device in response to the command queue; and
a subsidiary buffer control circuit configured to allocate, when the internal command is an asynchronous read command corresponding to an asynchronous read operation as the read operation, storage space for storing the read data to the buffer memory after the memory device completes the asynchronous read operation in response to the memory command.

9. The memory system according to claim 8, wherein the controller further comprises a main buffer control circuit configured to allocate, when the internal command is a normal read command corresponding to a normal read operation as the read operation, the storage space to the buffer memory before the flash control circuit outputs the memory command to the memory device.

10. The memory system according to claim 8, wherein the asynchronous read operation includes a plane interleaving operation or a cache read operation.

11. The memory system according to claim 8, wherein the buffer memory receives the read data from the memory device, stores the read data in the allocated storage space, and outputs the read data stored in the storage space to the host.

12. The memory system according to claim 11, wherein the buffer memory outputs the read data to the host and then releases the read data stores in the storage space.

13. The memory system according to claim 8,
wherein, when the read request corresponds to the asynchronous read operation, the controller controls the memory device to perform the asynchronous read operation, and allocates the storage space to the buffer memory after the asynchronous read operation is completed, and
wherein, when the read request corresponds to the normal read operation, the controller controls the memory device such that the normal read operation is performed after the storage space is allocated to the buffer memory.

14. A method of operating a memory system, comprising:
parsing, when a read request is received from a host, the read request, and generating an internal command;
outputting, when the internal command is an asynchronous read command, the asynchronous read command to the memory device;
performing, by the memory device, an asynchronous read operation in response to the asynchronous read command;
allocating storage space for storing read data that is read from the memory device to a buffer memory after the memory device completes the asynchronous read operation;
receiving the read data from the memory device and storing the read data in the allocated storage space of the buffer memory; and
outputting the read data stored in the allocated storage space to the host.

15. The method according to claim 14, further comprising:
allocating, when the internal command is a normal read command, the storage space to the buffer memory before the normal read command is output to the memory device;
outputting the normal read command to the memory device after the storage space is allocated to the buffer memory;
performing, by the memory device, a normal read operation in response to the normal read command;
receiving, after the memory device completes the normal read operation, the read data from the memory device and storing the read data in the allocated storage space of the buffer memory; and
outputting the read data stored in the allocated storage space to the host.

16. The method according to claim 14, wherein the asynchronous read operation includes a plane interleaving operation or a cache read operation.

17. A controller comprising:
- a processor configured to parse a read request received from a host, queue an internal command, and generate a command queue;
- a buffer memory configured to store read data received from a memory device, and output the stored read data to the host; and
- a buffer memory control circuit configured to allocate, when the internal command corresponds to an asynchronous read operation, storage space for storing the read data to the buffer memory after the asynchronous read operation of the memory device is completed.

18. The controller according to claim 17, wherein, when the internal command corresponds to a normal read operation, the buffer memory control circuit allocates the storage space for the read data to the buffer memory before the memory device performs the normal read operation.

19. The controller according to claim 18, wherein the buffer memory control circuit comprises:
- a main buffer control circuit configured to allocate the storage space to the buffer memory for the normal read operation; and
- a subsidiary buffer control circuit configured to allocate the storage space to the buffer memory after the asynchronous read operation of the memory device is completed.

20. The controller according to claim 19, further comprising a flash control circuit configured to generate and output a memory command for controlling the memory device in response to the command queue,
- wherein the main buffer control circuit allocates the storage space to the buffer memory before the flash control circuit transmits the memory command to the memory device, and
- wherein the subsidiary buffer control circuit allocates the storage space to the buffer memory after the flash control circuit transmits the memory command to the memory device.

* * * * *